United States Patent
Yamada

(10) Patent No.: US 8,164,393 B2
(45) Date of Patent: Apr. 24, 2012

(54) VIBRATING REED, VIBRATOR, OSCILLATOR, AND ELECTRONIC DEVICE

(75) Inventor: Akinori Yamada, Ina (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 12/896,482

(22) Filed: Oct. 1, 2010

(65) Prior Publication Data

US 2011/0084776 A1 Apr. 14, 2011

(30) Foreign Application Priority Data

Oct. 8, 2009 (JP) .................................. 2009-234068
Jul. 21, 2010 (JP) .................................. 2010-163647

(51) Int. Cl.
*H03B 5/32* (2006.01)
*H01L 41/04* (2006.01)
*H03H 9/21* (2006.01)

(52) U.S. Cl. ........ 331/156; 310/348; 310/367; 310/370; 333/200

(58) Field of Classification Search .............. 331/107 A, 331/154, 156, 158; 310/348, 367, 370; 333/200
See application file for complete search history.

(56) References Cited

U.S. PATENT DOCUMENTS

| | | | |
|---|---|---|---|
| 6,541,897 B2 * | 4/2003 | Endoh | 310/344 |
| 7,626,318 B2 * | 12/2009 | Dalla Piazza et al. | 310/370 |
| 7,859,172 B2 * | 12/2010 | Ishikawa et al. | 310/348 |
| 7,872,404 B2 * | 1/2011 | Numata et al. | 310/370 |
| 2004/0263027 A1 | 12/2004 | Kawashima | |
| 2009/0021120 A1 | 1/2009 | Dalla Piazza et al. | |

FOREIGN PATENT DOCUMENTS

| | | |
|---|---|---|
| JP | Y-51-10755 | 3/1976 |
| JP | A-2004-120249 | 4/2004 |
| JP | A-2004-282230 | 10/2004 |
| JP | A-2004-333416 | 11/2004 |
| JP | A-2005-005896 | 1/2005 |
| JP | A-2005-039767 | 2/2005 |
| JP | A-2009-027711 | 2/2009 |
| WO | WO 00/44092 A1 | 7/2000 |

* cited by examiner

*Primary Examiner* — Levi Gannon
(74) *Attorney, Agent, or Firm* — Oliff & Berridge, PLC

(57) ABSTRACT

A vibrating reed includes: a base; and a vibrating arm which is extended from one end portion of the base, the vibrating arm having an arm portion which is disposed on the base side, a weight portion which is disposed on a tip side of the arm portion and has a larger width than the arm portion, main surfaces which are respectively disposed on front and back sides of the vibrating arm, side surfaces each of which extends in a longitudinal direction of the vibrating arm to connect the main surfaces on the front and back sides and which are formed so as to face each other, a first groove portion which is a bottomed groove formed at least one of the main surfaces along the longitudinal direction of the vibrating arm, a first excitation electrode which is formed on groove side surfaces each connecting a bottom of the first groove portion with the one main surface, a second excitation electrode which is formed on the both side surfaces, and a projection-in-groove which is disposed on the tip side of a bisector bisecting the vibrating arm in the longitudinal direction and is formed so as to be along the groove side surface with a part of the first groove portion interposed between the projection-in-groove and the groove side surface.

13 Claims, 5 Drawing Sheets

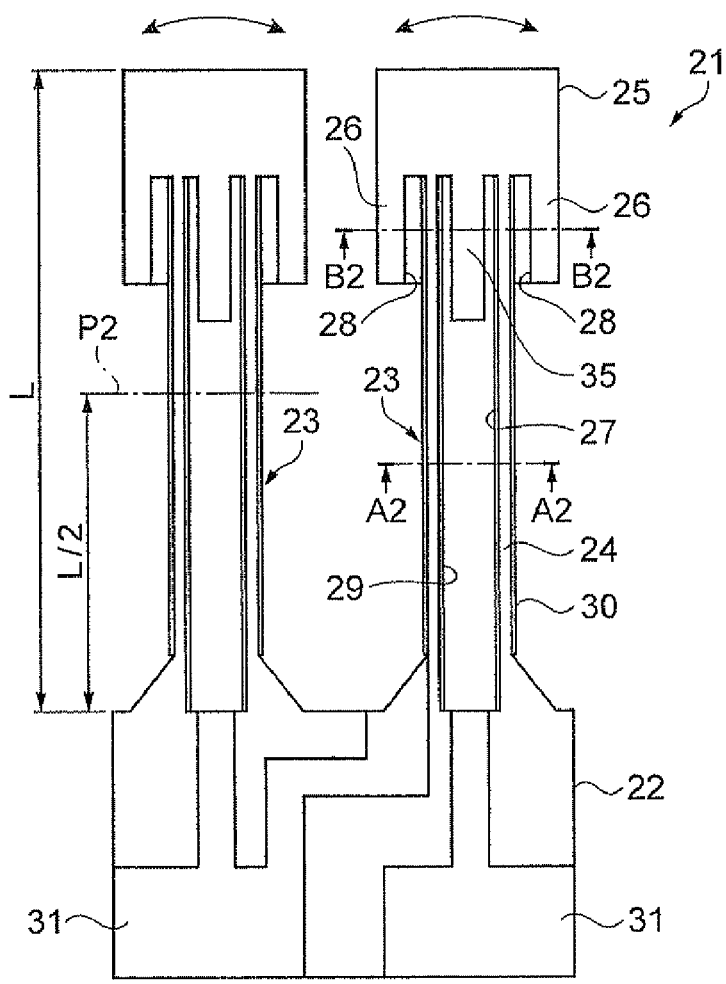
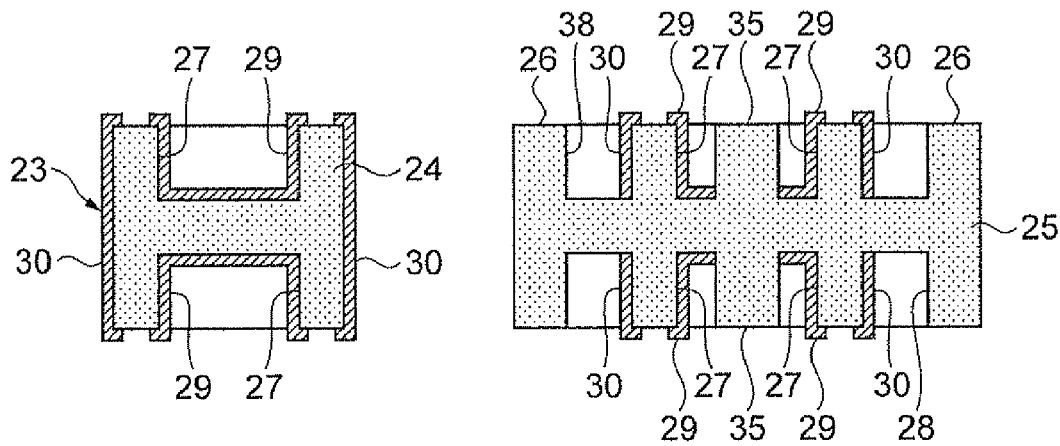
FIG. 2A
FIG. 2B  FIG. 2C

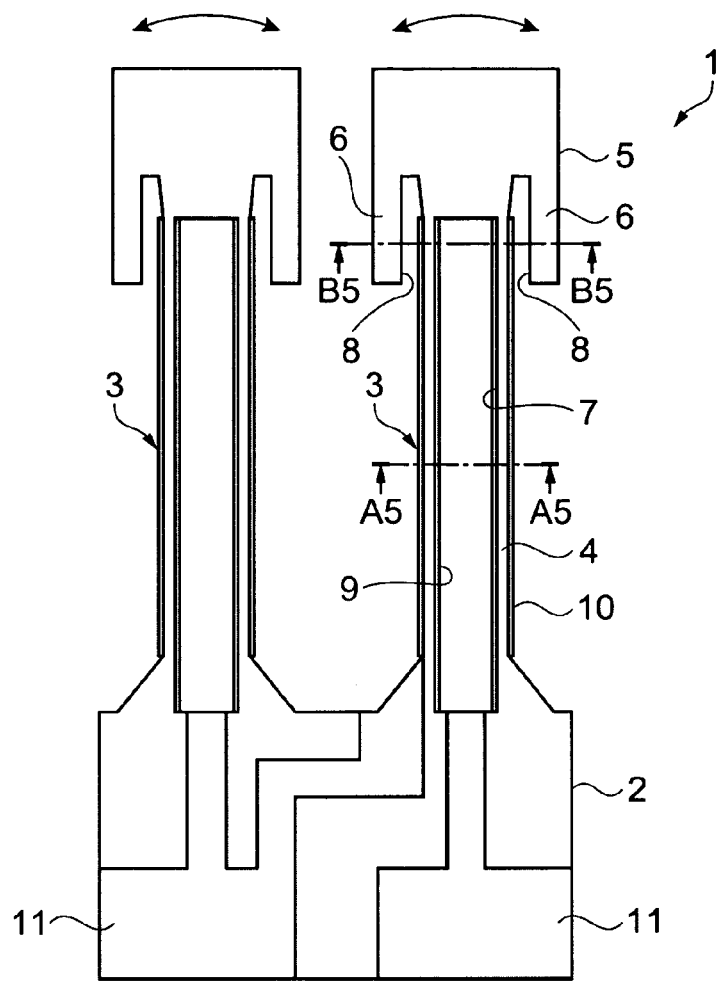
FIG. 6A
RELATED ART
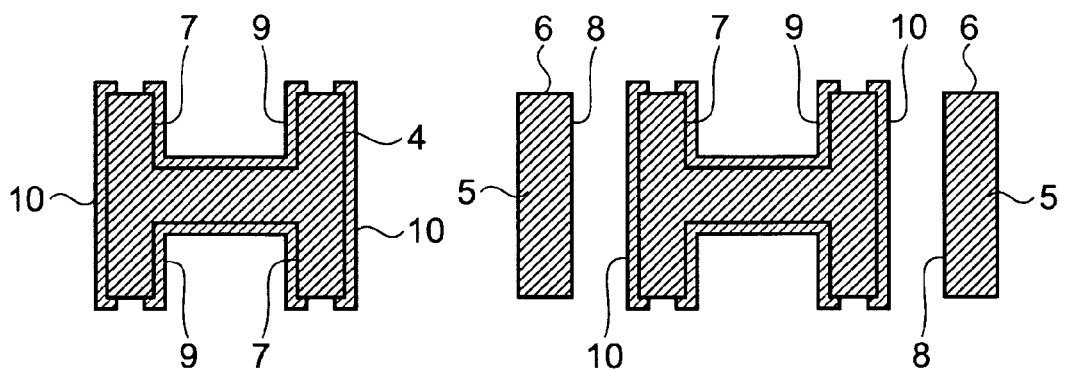
FIG. 6B
RELATED ART
FIG. 6C
RELATED ART

VIBRATING REED, VIBRATOR, OSCILLATOR, AND ELECTRONIC DEVICE

BACKGROUND

1. Technical Field

The present invention relates to a vibrating reed such as, for example, a piezoelectric vibrating reed made of a piezoelectric material, a vibrator, an oscillator, and an electronic device using these components.

2. Related Art

Piezoelectric devices have been widely used for communication equipment such as mobile phones, information equipment such as computers or IC cards, and other various electronic devices. Along with the miniaturization and higher performance of the electronic devices, high quality and high stability, together with its miniaturization, are recently demanded for the piezoelectric devices.

It is well known in a piezoelectric vibrating reed of the bending vibration mode that reducing the length of a vibrating arm for achieving its miniaturization increases frequency. Therefore, a mass is added to the tip portion of the vibrating arm, and due to the mass effect, the length of the vibrating arm is reduced while avoiding an increase in frequency, thereby miniaturizing the piezoelectric vibrating reed (refer to JP-UM-B-51-10755 and JP-A-2004-282230, for example). In many cases, a mass is added to the tip portion of the vibrating arm by forming the width of the tip portion larger than that of the base end side.

Moreover, for decreasing the CI value in a tuning-fork type piezoelectric vibrating reed, a structure has been widely adopted in which a groove portion in the longitudinal direction is formed at least one of both main surfaces of a vibrating arm, and an excitation electrode is deposited on the inner surface of the groove portion (refer to JP-A-2004-282230, for example). In such a vibrating arm, an electric field is generated between an excitation electrode of its side surface and the excitation electrode within the groove portion so as to widely distribute in a cross-section of the vibrating arm, and an electric field efficiency is greatly improved. Therefore, vibration loss is small even when the vibrating reed is miniaturized, and the CI value can be suppressed to a low level.

Further, a tuning-fork type piezoelectric vibrating reed having a structure in which a groove portion of a vibrating arm is extended to positions entering a weight portion at a tip of the vibrating arm and a base has been proposed (refer to JP-A-2005-5896, for example). In the vibrating arm having such a groove structure, an arm length necessary for obtaining the basic vibration mode of the vibrating arm can be assured, and at each of coupling portions of the vibrating arm with the weight portion and the base, concentration of stress on the groove portion due to the vibration of the vibrating arm can be eliminated to thereby obtain stable vibrations.

In JP-A-2005-5896, a vibrating arm in which a ridge portion is disposed on the base side of the weight portion for decreasing the CI value is disclosed. The vibrating arm will be described in detail with reference to the drawings. In FIGS. 6A to 6C, a tuning-fork type piezoelectric vibrating reed 1 disclosed in JP-A-2005-5896 has a base 2 and a pair of vibrating arms 3 extended in parallel from one end portion of the base 2. Each of the vibrating arms 3 has on the tip side of the vibrating arm 3 a weight portion 5 having a larger width than the vibrating arm 3 on the base 2 side, a first bottomed groove portion 7 formed along the long-side direction of the vibrating arm 3, a first excitation electrode 9 formed on each side surface of the first groove portion 7, and a second excitation electrode 10 formed on each side surface of the vibrating arm 3. On the base 2 side of the weight portion 5, a second groove portion 8 is disposed as a through hole. The second groove portion 8 has as one of side surfaces a side surface which is continuous from the side surface of the vibrating arm 3 and forms the same surface as that of the vibrating arm, and the one side surface is formed in parallel with the side surface of the first groove portion 7. With the second groove portion 8, a ridge portion (protruding portion) 6 is formed at both ends of the weight portion 5 on the base 2 side. Due to the ridge portion 6, in the vibrating arm 3, the arm length as the vibration secondary moment can be reduced without changing the mass of the weight portion 5, whereby the stability of vibration can be enhanced, and the CI value can be suppressed to a low level.

However, in the tuning-fork type crystal vibrating reed 1 disclosed in JP-A-2005-5896, since the second groove portion 8, which has as one of side surfaces the extending portion of the side surface of the vibrating arm 3, of the weight portion 5 is a through hole penetrating through both main surfaces of the weight portion 5, there is a risk of causing a disadvantage because each of the ridge portions 6 formed at both ends of the weight portion 5 on the base 2 side serves as a weight. That is, the present inventor has found that when the vibrating arm 3 repeats bending vibrations in directions indicated by the arrows in the drawing, the weight portion 5 exhibits a larger displacement than the vibrating arm 3 at the peak of the amplitude of vibration of the vibrating arm 3 and is brought into a vibration mode close to the higher-order mode, whereby frequency is increased to cause unstable vibrations and cause a risk of increasing the CI value.

SUMMARY

An advantage of some aspects of the invention is to solve at least a part of the problem described above, and the invention can be embodied as the following embodiments or application examples.

FIRST APPLICATION EXAMPLE

A first application example is directed to a vibrating reed including: a base; and a vibrating arm which is extended from one end portion of the base, the vibrating arm having an arm portion which is disposed on the base side, a weight portion which is disposed on a tip side of the arm portion and has a larger width than the arm portion, main surfaces which are respectively disposed on front and back sides of the vibrating arm, side surfaces each of which extends in a longitudinal direction of the vibrating arm to connect the main surfaces on the front and back sides and which are formed so as to face each other, a first groove portion which is a bottomed groove formed at least one of the main surfaces along the longitudinal direction of the vibrating arm, a first excitation electrode which is formed on groove side surfaces each connecting a bottom of the first groove portion with the one main surface, a second excitation electrode which is formed on the both side surfaces, and a projection-in-groove which is disposed on the tip side of a bisector bisecting the vibrating arm in the longitudinal direction and is formed so as to be along the groove side surface with a part of the first groove portion interposed between the projection-in-groove and the groove side surface.

According to this configuration, since the first groove portion is included, the vibrating arm becomes easy to move and efficiently vibrates, making it possible to lower the CI value. In addition, a mass is added to the tip side of the vibrating arm with the weight portion disposed on the tip side of the arm portion and the projection-in-groove disposed in the first groove portion, whereby frequency can be lowered without increasing the length of the vibrating arm. Accordingly, a vibrating reed with a small size and a low CI value can be provided.

SECOND APPLICATION EXAMPLE

A second application example is directed to the vibrating reed according to the above-described application example, wherein the projection-in-groove is disposed so as to protrude, in plan view, from the tip side of the vibrating arm toward the base side within the first groove portion.

It is preferable that the forming position of the projection-in-groove on the tip side of the vibrating arm is ruled like this configuration.

THIRD APPLICATION EXAMPLE

A third application example is directed to the vibrating reed according to the above-described application example, wherein the projection-in-groove is formed in an island shape with its periphery surrounded by the first groove portion in plan view.

According to the configuration, since the projection-in-groove is formed in an island shape in plan view within the first groove portion, a mass is added to the tip side of the vibrating arm, whereby frequency can be lowered without increasing the length of the vibrating arm.

FOURTH APPLICATION EXAMPLE

A fourth application example is directed to the vibrating reed according to the above-described application example, further including a second groove portion formed in the weight portion, wherein the second groove portion is a bottomed groove which includes as one of side surfaces a side surface which is continuous from the side surface of the arm portion and forms the same surface as that of the arm portion, the one side surface being formed so as to be in parallel with the side surface of the first groove portion, the first groove portion is disposed so as to extend from the base side of the vibrating arm into a region of the weight portion, the first excitation electrode is formed on the side surface which is continuous within the first groove portion from the base side of the vibrating arm into the region of the weight portion, and the second excitation electrode is formed on a surface which is continuous from the side surface of the vibrating arm to the one side surface within the second groove portion.

In this manner, the first excitation electrode is formed on the side surface of the first groove portion disposed from the base side of the vibrating arm into the region of the weight portion, and the second excitation electrode is formed continuously on the side surface of the vibrating arm on the base side and on the side surface of the weight portion, the side surface being continuous from the side surface of the vibrating arm. Therefore, an electric field contributing to the vibration of the vibrating arm can be generated not only in the arm portion of the vibrating arm but also in the region of the weight portion. Accordingly, even when the vibrating arm is shortened to meet the demand for miniaturization, the higher performance and higher quality of a piezoelectric vibrating reed can be realized by increasing an electrode area to enhance an excitation efficiency and decreasing the CI value, without impairing the mass effect of the weight portion.

Moreover, the present inventor has found that since the second groove portion is a bottomed groove, it is possible to avoid a disadvantage of an increase in frequency caused by the weight portion brought into a vibration mode close to the higher-order mode with respect to the vibrating arm when the second groove portion penetrating through the weight portion is disposed.

FIFTH APPLICATION EXAMPLE

A fifth application example is directed to the vibrating reed according to the above-described application example, wherein the projection-in-groove is formed to extend to the base side beyond a root portion of the weight portion with the vibrating arm.

In this configuration in which the weight portion is provided on the tip side, and the first groove portion is formed continuously from the base side of the vibrating arm into the region of the weight portion, an embodiment in which the projection-in-groove is formed from the region of the weight portion of the first groove portion so as to extend to the base side beyond the root portion of the weight portion with the vibrating arm is shown. With this configuration, the mass effect due to the projection-in-groove is more enhanced, providing a remarkable effect for the miniaturization of the vibrating reed.

SIXTH APPLICATION EXAMPLE

A sixth application example is directed to the vibrating reed according to the above-described application example, wherein the projection-in-groove is formed continuously from the weight portion.

According to this configuration, in a step of forming the first groove portion of the vibrating arm by etching, the projection-in-groove can be efficiently formed. In addition, etching residue which may be generated in a space portion when the projection-in-groove is formed with a space between the weight portion and the projection-in-groove can be prevented. Therefore, it is possible to form the projection-in-groove while adjusting it to the mass of the weight portion, making it possible to obtain a vibrating reed having a desired frequency characteristic.

SEVENTH APPLICATION EXAMPLE

A seventh application example is directed to the vibrating reed according to the above-described application example, wherein the projection-in-groove is formed to have the same height as the both main surfaces of the vibrating arm.

According to this configuration, in the step of forming the first groove portion of the vibrating arm by etching, the projection-in-groove can be efficiently formed.

EIGHTH APPLICATION EXAMPLE

An eighth application example is directed to the vibrating reed according to the above-described application example, which is a piezoelectric vibrating reed formed of a piezoelectric material.

According to this configuration, it is possible to provide a piezoelectric vibrating reed such as, for example, a crystal vibrating reed made of crystal with high impact resistance and excellent vibration characteristics.

NINTH APPLICATION EXAMPLE

A ninth application example is directed to a vibrator including: the vibrating reed according to any of the above-described application examples; and a package which contains the vibrating reed.

According to this configuration, since the vibrating reed according to any of the above-described application examples is included, it is possible to provide a vibrator with a small size and stable vibration characteristics.

TENTH APPLICATION EXAMPLE

A tenth application example is directed to an oscillator including: the vibrating reed according to any of the above-described application examples; a circuit element which includes an oscillator circuit oscillating the vibrating reed; and a package which contains the vibrating reed and the circuit element.

According to this configuration, the vibrating reed according to any of the above-described application examples is included, it is possible to provide an oscillator with a small size and stable vibration characteristics.

ELEVENTH APPLICATION EXAMPLE

An eleventh application example is directed to an electronic device including any of the vibrating reed according to any of the above-described application examples, the vibrator according to the above-described application example, and the oscillator according to the above-described application example.

According to this configuration, it is possible to provide a small and light-weighted electronic device with stable operation.

TWELFTH APPLICATION EXAMPLE

A twelfth application example is directed to a vibrating reed including: a base; a vibrating arm which is extended from one end portion of the base, the vibrating arm including both main surfaces and both side surfaces each of which connects the both main surfaces and extends in a longitudinal direction of the vibrating arm; a first groove portion which is a bottomed groove formed at least one of the both main surfaces along the longitudinal direction of the vibrating arm; a first excitation electrode which is formed on both side surfaces within the first groove portion; a second excitation electrode which is formed on the both side surfaces of the vibrating arm; and a projection-in-groove which is formed in the first groove portion for adding a mass, the projection-in-groove being positioned between the both side surfaces within the first groove portion on a tip side of the vibrating arm and disposed on the tip side of a bisector bisecting the vibrating arm in the longitudinal direction.

According to this configuration, since the first groove portion is included, the vibrating arm becomes easy to move and efficiently vibrates, whereby the CI value can be lowered. In addition, a mass is added to the tip side of the vibrating arm with the projection-in-groove disposed in the first groove portion, whereby frequency can be lowered without increasing the length of the vibrating arm. Accordingly, a vibrating reed with a small size and a low CI value can be provided.

THIRTEENTH APPLICATION EXAMPLE

A thirteenth application example is directed to the vibrating reed according to the above-described application example, wherein the vibrating arm includes an arm portion positioned on the base side of the vibrating arm and a weight portion positioned on the tip side of the arm portion and having a larger width than the arm portion.

According to this configuration, since the weight portion at the tip portion of the vibrating arm functions as a weight, frequency can be lowered without increasing the length of the vibrating arm. Therefore, by adjusting the shape of the weight portion together with the effect of decreasing the CI value due to the formation of the groove portion, a vibrating reed with a small size and high performance can be provided.

BRIEF DESCRIPTION OF THE DRAWINGS

The invention will be described with reference to the accompanying drawings, wherein like numbers reference like elements.

FIGS. 1A to 1C schematically illustrate a piezoelectric vibrating reed of a first embodiment, in which FIG. 1A is a plan view; FIG. 1B is a cross-sectional view along the line A1-A1 of FIG. 1A; and FIG. 1C is a cross-sectional view along the line B1-B1 of FIG. 1A.

FIGS. 2A to 2C schematically illustrate a piezoelectric vibrating reed of a second embodiment, in which FIG. 2A is a plan view; FIG. 2B is a cross-sectional view along the line A2-A2 of FIG. 2A; and FIG. 2C is a cross-sectional view along the line B2-B2 of FIG. 2A.

FIGS. 3A to 3C schematically illustrate a piezoelectric vibrating reed of a third embodiment, in which FIG. 3A is a plan view; FIG. 3B is a cross-sectional view along the line A3-A3 of FIG. 3A; and FIG. 3C is a cross-sectional view along the line B3-B3 of FIG. 3A.

FIGS. 4A and 4B are schematic views showing a schematic configuration of a vibrator of a fourth embodiment, in which FIG. 4A is a plan view; and FIG. 4B is a cross-sectional view along the line F-F of FIG. 4A.

FIGS. 5A and 5B are schematic views showing a schematic configuration of an oscillator of a fifth embodiment, in which FIG. 5A is a plan view; and FIG. 5B is a cross-sectional view along the line G-G of FIG. 5A.

FIG. 6 is a plan view schematically showing a tuning-fork type crystal vibrating reed as a related-art vibrating reed.

DESCRIPTION OF EXEMPLARY EMBODIMENTS

Hereinafter, embodiments in which a vibrating reed of the invention is embodied will be described with reference to the drawings.

First Embodiment

Figure 1A:
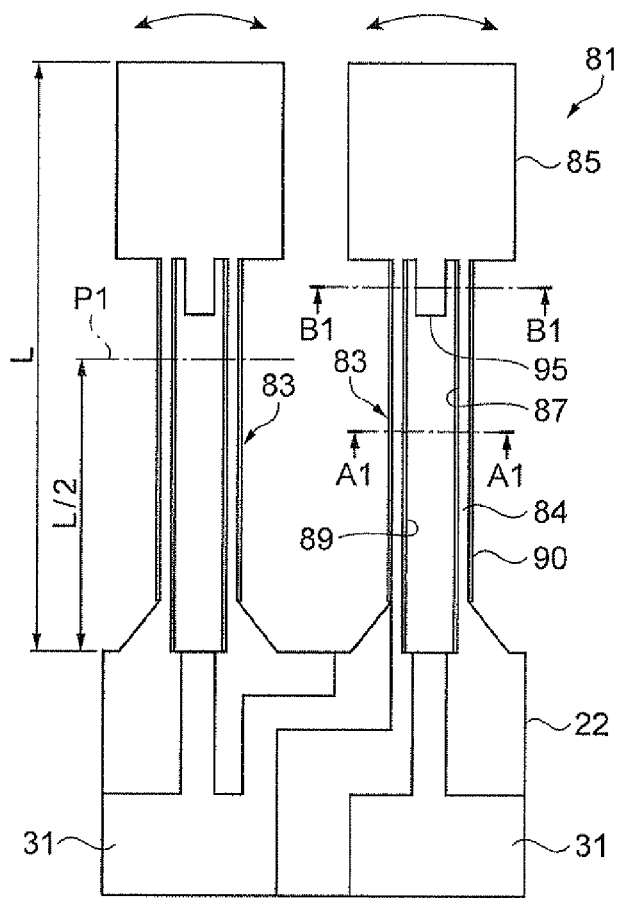
Figures 1B, 1C:
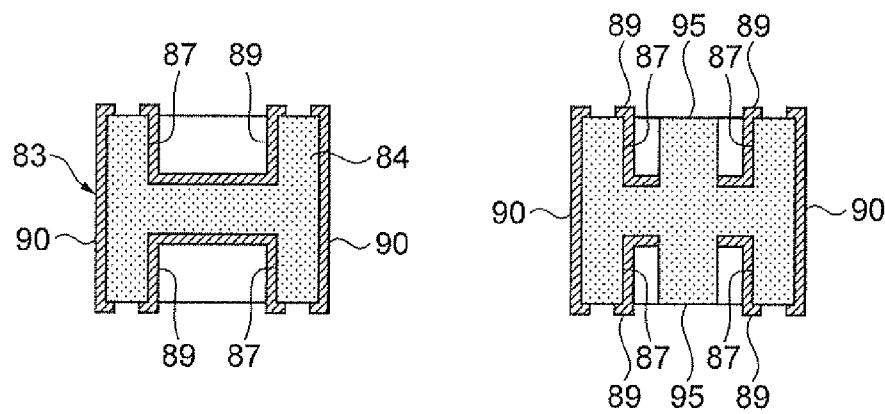

FIGS. 1A to 1C schematically illustrate a piezoelectric vibrating reed as a vibrating reed of a first embodiment, in which FIG. 1A is a plan view as viewed from one of main surface sides; FIG. 13 is a cross-sectional view along the line A1-A1 of FIG. 1A; and FIG. 1C is a cross-sectional view along the line B1-B1 of FIG. 1A.

In FIGS. 1A to 1C, the piezoelectric vibrating reed 81 is made of a piezoelectric material such as crystal. When the piezoelectric vibrating reed 81 is configured of crystal, a crystal "Z" plate is used for a crystal wafer (crystal substrate) as an original shape of a substrate. The crystal "Z" plate is obtained by cutting out while rotating within a range of 0 to 5 degrees in clockwise about the Z-axis in the orthogonal coordinate system composed of the X-, Y-, and Z-axes, and then the crystal "Z" plate is cut and polished to a predetermined thickness. The piezoelectric vibrating reed 81 of the embodiment is formed to have an outer shape of the so-called tuning-fork type, including a base 22 which is formed by processing the crystal Z plate and a pair of vibrating arms 83 which bifurcate from one end side (upper end side in the drawing) of the base 22 in parallel with each other.

The pair of vibrating arms 83 are extended from one end side of the base 22 so as to be in parallel with each other. The vibrating arms 83 has main surfaces as front and back surfaces when the pair of vibrating arms 83 are viewed in plan and two side surfaces (hereinafter, the two side surfaces are also referred to as both side surfaces) each of which is formed by connecting, in the thickness direction of the vibrating arm 83, edge sides with each other located on both sides of the vibrating arm 83 in the width direction on the respective main surfaces as the front and back surfaces, and are formed so as to face each other on both sides of the vibrating arm 83. That is, the both side surfaces are located on both sides of the vibrating arm 83 in the width direction to face each other, and are formed to extend in the longitudinal direction (extending direction) of the vibrating arm 83.

On the tip side of each of the vibrating arms 83, a weight portion 85 having a larger width than the vibrating arm 83 on the base 22 side is disposed. In this manner, the weight portion 85 at the tip portion of each of the vibrating arms 83 functions as a weight, whereby frequency can be lowered without increasing the length of the vibrating arm 83.

For the vibrating arm 83 of the embodiment, a configuration in which other portions than the weight portion 85 have a constant width has been illustrated. However, this is not restrictive. An arm portion (portion from the base 22 to the weight portion 85) of the vibrating arm 83 may have a shape which narrows from the base 22 side of the vibrating arm 83 toward the weight portion 85 at the tip portion. For example, by forming a taper which narrows from the base 22 side of the vibrating arm 83 toward the weight portion 85 on the tip side, the vibrating arm 83 can easily vibrate.

As shown in FIG. 1A, in one of the main surfaces of each of the vibrating arms 83, a first bottomed groove portion 87 is disposed along the longitudinal direction of the vibrating arm. As shown in FIG. 1B, also in the other main surface of the vibrating arm 83, a first bottomed groove portion 87 is disposed along the longitudinal direction of the vibrating arm 83.

Due to the first groove portion 87 which is disposed with an opening in the both main surfaces of each of the vibrating arms 83, the vibrating arm 83 becomes easy to move and efficiently vibrates, thereby making it possible to lower the CI value.

The first groove portion 87 disposed in each of the vibrating arms 83 is disposed at one end side thereof (the tip side of the vibrating arm 83) to a boundary between the weight portion 85 and the vibrating arm 83.

On each side surface of the first groove portion from the base 22 side to the tip side, a first excitation electrode 89 is formed. On each of the side surfaces of the vibrating arm 83 from the base 22 side to the tip side, a second excitation electrode 90 is formed.

A projection-in-groove 95 for adding a mass is disposed within the first groove portion 87. The projection-in-groove 95 is located on the tip side (on the tip side of a bisector P1 which bisects the vibrating arm 83 in the longitudinal direction) of a half L/2 of a length L which is a length from a base end as a connection portion of the vibrating arm 83 with the base 22 to a tip (tip of the weight portion 85).

In this case, for obtaining a mass addition effect of the projection-in-groove 95, the projection-in-groove 95 is positioned on the tip side of the half L/2 of the length L which is the length from the base end as the connection portion of the vibrating arm 83 with the base 22 to the tip. On the other hand, when the projection-in-groove 95 is disposed on the base 22 side of the half L/2 of the length L, the rigidity of each of the vibrating arms 83 is increased, resulting in a high resonant frequency. Therefore, the length of the vibrating arm 83 needs to be increased (extended) for obtaining a desired resonant frequency, and the function of the projection-in-groove 95 as a weight effect for reducing (shortening) the length of the vibrating arm 83 is not exhibited.

The projection-in-groove 95 shows an example in which the projection-in-groove is formed by etching simultaneously with the first groove portion 87. As shown in FIG. 1C, the projection-in-groove 95 has the same height as the main surface of the vibrating arm 83 and is formed within the first groove portion 87 continuously from the weight portion 85 at the boundary portion between the weight portion 85 and the vibrating arm 83 toward the base 22 side. In other words, the projection-in-groove 95 is formed to protrude from the weight portion 85 to the first groove portion 87 so as to be along groove side surfaces on both sides of the first groove portion 87. With this configuration, a part of the first groove portion 87 along the projection-in-groove 95 has a shape divided into two portions (bifurcated shape), so that the projection-in-groove 95 faces the groove side surfaces on both sides with the bifurcated portions as the part of the first groove portion 87 interposed therebetween.

The projection-in-groove 95 of the embodiment is formed by etching simultaneously with the first groove portion 87. Therefore, the projection-in-groove 95 has the same height as the main surface of the vibrating arm and is formed within the first groove portion 87 continuously from the weight portion 85 at the boundary portion between the weight portion 85 and the vibrating arm 83 toward the base 22 side. In this manner, by simultaneously forming the projection-in-groove 95 in the step of forming the first groove portion 87 of the vibrating arm 83 by etching, the projection-in-groove 95 can be efficiently formed.

The first excitation electrode 89 is formed on each of the continuous side surfaces of the first groove portion 87. In the piezoelectric vibrating reed 81 of the embodiment, the first excitation electrode 89 is also formed continuously on a recessed bottom surface which connects the both side surfaces of the first bottomed groove portion 87.

Electrodes such as the first excitation electrode 89 and the second excitation electrode 90, wirings, and the like can be formed as follows: crystal is etched to form an outer shape including the first groove portion 87 of the piezoelectric vibrating reed 81; an electrode layer made of, for example, gold (Au) is deposited on an under layer made of, for example, nickel (Ni) or chromium (Cr) by vapor deposition or sputtering; and thereafter, the electrode layer is patterned using photolithography. It is known in this case that chromium has high adhesion to crystal, and that gold has low electrical resistance and is hardly oxidized.

According to the piezoelectric vibrating reed 81 of the embodiment, on the tip side of the half L/2 of the length L which is the length from the base end as the connection portion of the vibrating arm 83 with the base to the tip, the projection-in-groove 95 for adding a mass is formed from the tip side of the vibrating arm 83 toward the base 22 side within the first groove portion 87. With this configuration, a mass is added to the tip side of the vibrating arm 83 with the projection-in-groove 95 disposed in the first groove portion 87, whereby frequency can be lowered without increasing (extending) the length of the vibrating arm 83. Accordingly, a vibrating reed with a small size and a low CI value can be provided.

Second Embodiment

FIGS. 2A to 2C schematically illustrate a piezoelectric vibrating reed as a vibrating reed of a second embodiment, in which FIG. 2A is a plan view as viewed from one of main surface sides; FIG. 2B is a cross-sectional view along the line A2-A2 of FIG. 2A; and FIG. 2C is a cross-sectional view along the line B2-B2 of FIG. 2A. In the configuration of the piezoelectric vibrating reed of the embodiment, constituents having the same configuration as in the first embodiment are denoted by the same reference numeral and sign, and the description thereof is omitted.

Since a substrate constituting the piezoelectric vibrating reed 21 is similar to that of the first embodiment, the description thereof is omitted. The piezoelectric vibrating reed 21 of the embodiment is formed to have an outer shape of the so-called tuning-fork type, including the base 22 and a pair of vibrating arms 23 which bifurcate from one end side (upper end side in the drawing) of the base 22 in parallel with each other.

The pair of vibrating arms 23 are extended from one end side of the base 22 so as to be in parallel with each other. Each of the vibrating arms 23 has both main surfaces as front and back surfaces when the pair of vibrating arms 23 are viewed in plan and two side surfaces each of which is formed by connecting an edge side with an edge side in the width direction of the vibrating arm 23 of the respective main surfaces and which are formed so as to face each other on both sides of the vibrating arm 83. That is, the both side surfaces face each other on both sides of the vibrating arm 23 and are formed to extend in the longitudinal direction (extending direction) of the vibrating arm 23.

On the tip side of each of the vibrating arms 23, a weight portion 25 having a larger width than the vibrating arm 23 on the base 22 side is disposed. In this manner, the weight portion 25 at the tip portion of the vibrating arm 23 functions as a weight, whereby frequency can be lowered without increasing (extending) the length of the vibrating arm 23.

An arm portion (portion from the base 22 to the weight portion 25) of the vibrating arm 23 may have a shape which narrows from the base 22 side of the vibrating arm 23 toward the weight portion 25 on the tip side. For example, by forming a taper which narrows from the base 22 side of the vibrating arm 23 toward the weight portion 25 on the tip side, the vibrating arm 23 can easily vibrate.

As shown in FIG. 2A, in one of the main surfaces of each of the vibrating arms 23, a first bottomed groove portion 27 is disposed along the longitudinal direction of the vibrating arm. As shown in FIG. 23, also in the other main surface of the vibrating arm 23, a first bottomed groove portion 27 is disposed along the longitudinal direction of the vibrating arm 23.

Due to the first groove portion 27 which is disposed with an opening in the both main surfaces of the vibrating arm 23 as described above, the vibrating arm 23 becomes easy to move and efficiently vibrates, thereby making it possible to lower the CI value.

In each of the vibrating arms 23 of the embodiment, the first groove portion 27 is disposed at one end side thereof (the tip side of the vibrating arm 23) so as to extend from the base 22 side of the vibrating arm 23 into a region of the weight portion 25 on the tip side beyond the boundary between the weight portion 25 and the vibrating arms 23. With this configuration, since the region on which a stress caused upon the vibration of the vibrating arm 23 is concentrated is distributed in the extending direction of the vibrating arm 23, it is possible to avoid a disadvantage such as breakage caused by a stress concentrated on a root portion of the weight portion 25 of the vibrating arm 23.

Second bottomed groove portions 28 are disposed on the base 22 side of the weight portion 25. Each of the second bottomed groove portions 28 has as one of side surfaces a side surface which is continuous from the side surface of the vibrating arm 23 and forms the same surface as that of the vibrating arm, and the one side surface is formed to be in parallel with the side surface of the first groove portion 27. With the second groove portion 28, a ridge portion 26 is formed at both ends of the weight portion 25 on the base 22 side.

On the tip side of each of the vibrating arms 23, a projection-in-groove 35 for adding a mass is formed so as to protrude, in plan view, from the tip side of the vibrating arms 23 toward the base 22 side within the first groove portion 27. The projection-in-groove 35 is located between the both side surfaces of the first groove portion 27 and on the tip side of the half L/2 of the length L which is the length from a base end as a connection portion of the vibrating arm 23 with the base 22 to a tip. In other words, the projection-in-groove 35 is formed within the first groove portion 27 so as to be positioned on the tip side of a bisector P2 which bisects the vibrating arm 23 in the longitudinal direction.

In the embodiment, the projection-in-groove 35 is formed from an end of the first groove portion 27, which is formed to extend into the region of the weight portion 25, on the vibrating-arm-23-tip side so as to extend to the base 22 side beyond the boundary between the weight portion 25 and the vibrating arm 23. With this configuration, a mass effect due to the projection-in-groove 35 is enhanced, providing a remarkable effect for miniaturization of a vibrating reed.

The projection-in-groove 35 of the embodiment is formed simultaneously with the first groove portion 27 by etching. As shown in FIG. 2C, therefore, the projection-in-groove 35 has the same height as the main surface of the vibrating arm 23 and is formed continuously from the vibrating-arm-23-tip side of the weight portion 25 to the base 22 side of the first groove portion 27. In this manner, by simultaneously forming the projection-in-groove 35 in the step of forming the first groove portion 27 of the vibrating arm 23 by etching, the projection-in-groove 35 can be efficiently formed.

A first excitation electrode 29 is formed on each of continuous side surfaces of the first groove portion 27 from the base 22 side of the vibrating arm 23 into the region of the weight portion 25. In the piezoelectric vibrating reed 21 of the embodiment, the first excitation electrode 29 is also formed continuously on a recessed bottom surface which connects the both side surfaces of the first bottomed groove portion 27.

A second excitation electrode 30 is formed on the side surface (the one side surface of the second groove portion 28) which is continuous from the base 22 side of the vibrating arm 23 to the second groove portion 28 in the region of the weight portion 25.

The first excitation electrode 29 of one of the vibrating arms 23 and the second excitation electrode 30 of the other vibrating arm 23 are connected to each other, and AC voltage is applied from connection electrodes 31 and 31 drawn to the base 22, whereby the both vibrating arms 23 and 23 vibrate in directions toward each other and away from each other.

Since electrodes such as the first excitation electrode 29 and the second excitation electrode 30, wirings, and the like are similar to those in the first embodiment, the descriptions thereof are omitted.

According to the piezoelectric vibrating reed 21 of the embodiment, the vibrating arm 23 is configured as follows: the first groove portion 27 is disposed so as to extend to the region of the weight portion 25; the second groove portion 28 is disposed such that the both side surfaces of the vibrating arm 23 are linearly extended from the end of the weight portion 25 on the base 22 side into the region of the weight portion 25; and the first excitation electrode 29 and the second excitation electrode 30 which contribute to the excitation of the vibrating arm 23 are formed not only in the arm portion of the vibrating arm 23 but also in the region of the weight portion 25. With this configuration, the piezoelectric vibrating reed 21 of the embodiment can enhance excitation efficiency by increasing the areas of the first excitation electrode 29 and the second excitation electrode 30 without impairing the mass effect of the weight portion 25 even when the vibrating arm 23 is shortened to meet the demand for miniaturization. Therefore, the CI value can be lowered.

In the piezoelectric vibrating reed 21 of the embodiment in this case, on the tip side of the half L/2 of the length L which is the length from the base end as the connection portion of the vibrating arm 23 with the base 22 to the tip, the projection-in-groove 35 for adding a mass is formed from the tip side of the vibrating arm 23 toward the base 22 side within the first groove portion 27. With this configuration, a mass is added to the tip side of the vibrating arm 23 with the projection-in-groove 35 disposed in the first groove portion 27, whereby frequency can be lowered without increasing (extending) the length of the vibrating arm 23. Accordingly, a vibrating reed with a small size and a low CI value can be provided.

Further in the embodiment, the second groove portion 28 formed in the weight portion 25 is formed as a bottomed groove with the side surface continuous from the side surface of the vibrating arm 23 as one side surface. With this configuration, it is possible to avoid a disadvantage of an increase in frequency caused by the vibrating arm 23 brought into a vibration mode close to higher-order modes when, for example, the second groove portion penetrating through the weight portion 25 is disposed.

Third Embodiment

In the second embodiment, the configuration has been described in which the projection-in-groove 35 is formed continuously from the vibrating-arm-23-tip side of the weight portion 25 toward the base 22 side within the first groove portion 27. However, this is not restrictive. The projection-in-groove disposed within the first groove portion on the tip side of the vibrating arm may be disposed with a predetermined space from the weight portion.

Figure 3A:
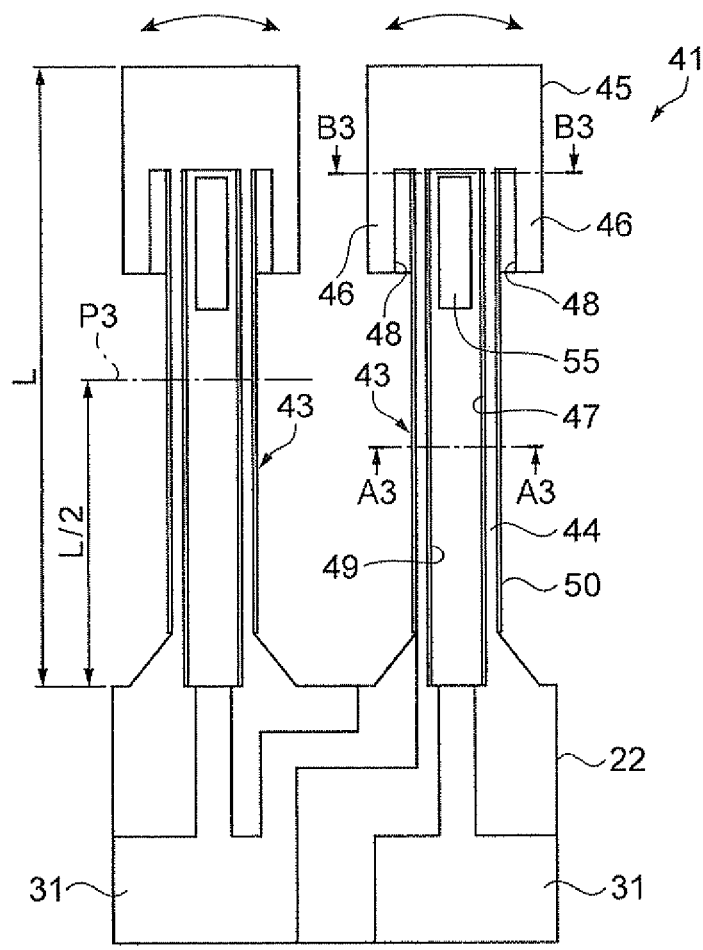
Figures 3B, 3C:
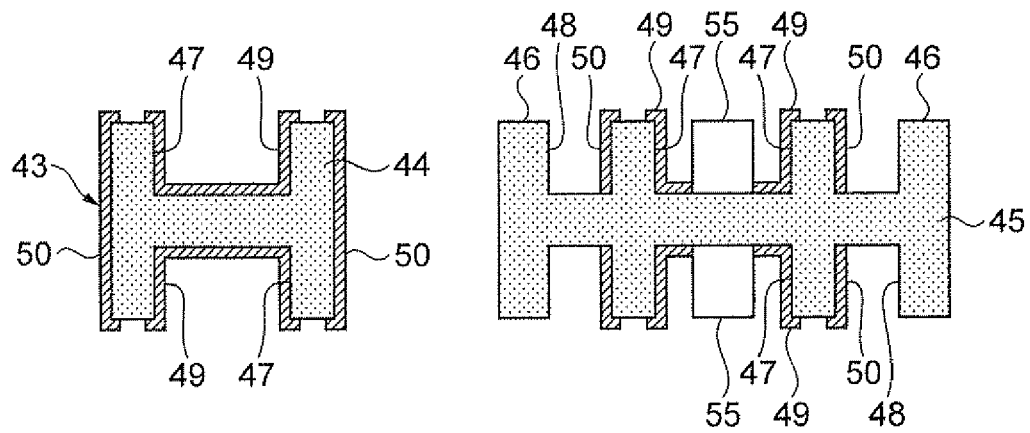

FIGS. 3A to 3C schematically illustrate a piezoelectric vibrating reed as a third embodiment having a configuration in which a projection-in-groove is disposed with a space from the weight portion, in which FIG. 3A is a plan view as viewed from one of main surface sides; FIG. 3B is a cross-sectional view along the line A3-A3 of FIG. 3A; and FIG. 3C is a cross-sectional view along the line B3-B3 of FIG. 3A. In the configuration of the piezoelectric vibrating reed of the embodiment, constituents having the same configuration as in the above embodiments are denoted by the same reference numeral and sign, and the description thereof is omitted.

In FIG. 3A, the piezoelectric vibrating reed 41 has a pair of vibrating arms 43 which bifurcate from one end side (upper end side in the drawing) of the base 22 and extend in parallel with each other. On the tip side of each of the vibrating arms 43, a weight portion 45 having a larger width than the vibrating arm 43 on the base 22 side is disposed. In both main surfaces of each of the vibrating arms 43, a first bottomed groove portion is disposed along the longitudinal direction of the vibrating arm. The first groove portion 47 is disposed at one end side thereof (the tip side of the vibrating arm 43) so as to extend into a region of the weight portion 45.

Second bottomed groove portions 48 are disposed on the base 22 side of the weight portion 45. Each of the second bottomed groove portions 48 has as one of side surfaces a side surface which is continuous from the side surface of the vibrating arm 43 and forms the same surface as that of the vibrating arm, and the one side surface is formed to be in parallel with the side surface of the first groove portion 47.

With the second groove portion 48, a ridge portion 46 is formed at both ends of the weight portion 45 on the base 22 side.

A first excitation electrode 49 is formed on each of continuous side surfaces of the first groove portion 47 from the base 22 side of the vibrating arm 43 into the region of the weight portion 45. A second excitation electrode 50 is formed on the side surface (the one side surface of the second groove portion 48) continuous from the base 22 side of the vibrating arm 43 to the second groove portion 48 within the region of the weight portion 45.

A projection-in-groove 55 for adding a mass is disposed within the first groove portion 47 with a predetermined space from the weight portion 45. The projection-in-groove 55 is located on the tip side (the tip side of a bisector P3 which bisects the vibrating arm 43 in the longitudinal direction) of the half L/2 of the length L which is the length from a base end as a connection portion of the vibrating arm 43 with the base 22 to a tip. In other words, when the vibrating arm 43 is viewed in plan from the main surface side as the front surface, the projection-in-groove 55 is formed in a so-called island shape with its periphery surrounded by the first groove portion 47.

The projection-in-groove 55 is formed at one end thereof on the base 22 side so as to extend to the base 22 side beyond the boundary between the weight portion 45 and the vibrating arm 43. The projection-in-groove 55 of the embodiment shows an example in which the projection-in-groove 55 is formed by etching simultaneously with the first groove portion 47. As shown in FIG. 3C, the projection-in-groove 55 has the same height as the main surface of the vibrating arm 43 and is formed from the weight portion 45 side toward the base 22 side with a predetermined space from the weight portion 45 within the first groove portion 47.

Like the piezoelectric vibrating reed 41 of the embodiment, even when the projection-in-groove 55 disposed within the first groove portion 47 on the tip side of the vibrating arm 43 is disposed with a predetermined space from the weight portion 45, since a mass is added to the tip side of the vibrating arm 43 with the projection-in-groove 55, frequency can be lowered without increasing (extending) the length of the vibrating arm 43. Therefore, the piezoelectric vibrating reed 41 with a small size and a low CI value can be provided.

The embodiments of the invention made by the present inventor have been specifically described. However, the invention is not limited to the above embodiments and can be variously modified within a range not departing from the gist thereof.

In the above embodiment for example, the piezoelectric vibrating reed 21 of the bending vibration mode has been described as one example. However, this is not restrictive. Also in a vibrating reed of a vibration mode other than the bending vibration mode, such as the torsional vibration mode, advantages such as an improvement in impact resistance can be obtained similarly to the above embodiment by including a characteristic configuration of the invention.

In the above embodiments, the piezoelectric vibrating reeds 21, 41, and 81 of the so-called tuning-fork type in which the respective two vibrating arms 23, 43, and 83 are formed so as to extend from the base 22 in parallel with each other have been described. However, this is not restrictive. The piezoelectric vibrating reed may be a so-called beam type vibrating reed or the like configured only of one vibrating arm having a base as a fixed end. Alternatively, even when a vibrating reed has three or more vibrating arms, the same advantages as those of the above embodiments can be obtained.

In the above embodiment, although the piezoelectric vibrating reed 21 made of crystal which is one of piezoelectric materials has been described, this is not restrictive. The piezoelectric vibrating reed can be formed of other piezoelectric materials than crystal, such lithium tantalate or lithium niobate. Further, even when a vibrating reed is formed of other material than piezoelectric materials, for example, a silicon semiconductor, the same advantages as those of the above embodiments can be obtained.

Fourth Embodiment

As a fourth embodiment, a vibrator including the piezoelectric vibrating reed described in the above-described embodiment as a vibrating reed will be next described.

Figure 4A:
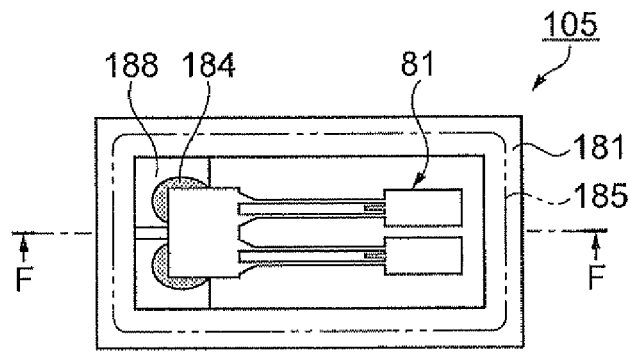
Figure 4B:
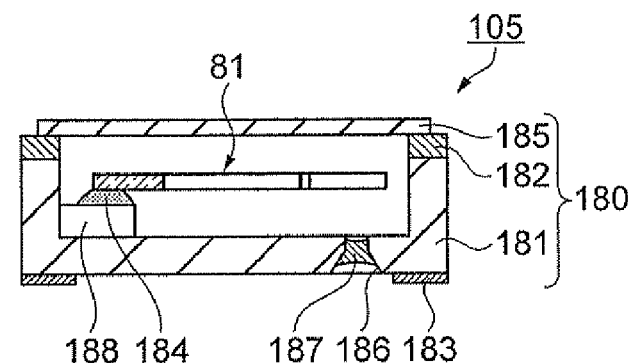

FIGS. 4A and 4B are schematic views showing a schematic configuration of the vibrator of the fourth embodiment, in which FIG. 4A is a plan view; and FIG. 4B is a cross-sectional view along the line F-F of FIG. 4A. In the embodiment, a configuration in which the piezoelectric vibrating reed 81 (crystal vibrating reed) described in the first embodiment as a vibrating reed is used as an example will be shown and described.

As shown in FIGS. 4A and 4B, a crystal vibrator 105 as a vibrator includes the piezoelectric vibrating reed 81 of the first embodiment and a package 180 which contains the piezoelectric vibrating reed 81. The package 180 is composed of a package base 181, a seam ring 182, a lid member 185, and the like. A recess is formed in the package base 181 so that the package base 181 can contain the piezoelectric vibrating reed 81. In the recess, connection pads 188 which are connected to not-shown mounting electrodes of the piezoelectric vibrating reed 81 are disposed. The connection pad 188 is connected to a wiring within the package base 181 so as to be capable of establishing electrical continuity with an external connection terminal 183 disposed at a peripheral portion of the package base 181.

The seam ring 182 is disposed around the recess of the package base 181. Further, a through hole 186 is formed through the bottom of the package base 181. The piezoelectric vibrating reed 81 is adhesively fixed to the connection pads 188 of the package base 181 via a conductive adhesive 184. In the package 180, the lid member 185 covering the recess of the package base 181 and the seam ring 182 are seam-welded together. A sealing material 187 formed of a metal material or the like is filled into the through hole 186 of the package base 181. The sealing material 187 is melted and then solidified in a reduced-pressure atmosphere, and hermetically seals the through hole 186 so that a reduced-pressure state can be maintained in the package base 181. The piezoelectric vibrating reed 81 is excited by a drive signal from the outside through the external connection terminal 183, so that the crystal vibrator 105 oscillates (resonates) at a predetermined frequency (for example, 32.768 kHz).

As described above, since the crystal vibrator 105 includes the piezoelectric vibrating reed 81 with a small size and a low CI value described in the above embodiment, the crystal vibrator 105 with a small size and stable vibration characteristics can be provided.

Even when the crystal vibrator 105 uses, instead of the piezoelectric vibrating reed 81, the above-described vibrating reeds of the other embodiments, for example, the piezoelectric vibrating reed 21 or 41, the same advantages can be obtained.

In the embodiment, the configuration in which the piezoelectric vibrating reed 81 is fixed to the connection pads 188 disposed at two places has been described. However, the number of places of the connection pad 188 is not limited to two, and a desired number of connection pads may be disposed. Also the connection with the piezoelectric vibrating reed 81 can be made at a desired connection place.

Fifth Embodiment

As a fifth embodiment, an oscillator including the piezoelectric vibrating reed described above as a vibrating reed will be next described.

Figure 5A:
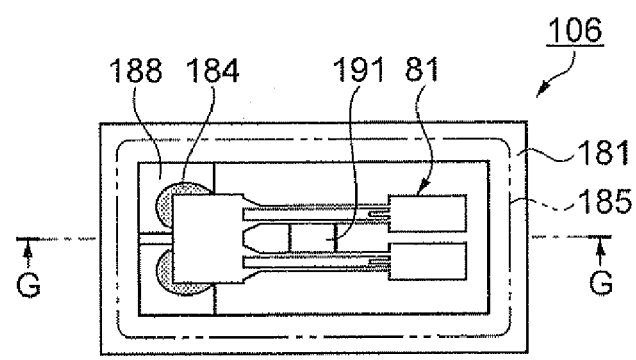
Figure 5B:
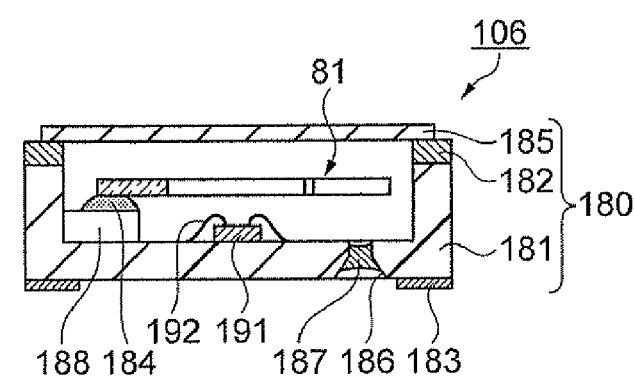

FIGS. 5A and 5B are schematic views showing a schematic configuration of the oscillator of the fifth embodiment, in which FIG. 5A is a plan view; and FIG. 5B is a cross-sectional view along the line G-G of FIG. 5A. In the embodiment, a configuration in which the piezoelectric vibrating reed 81 described in the first embodiment as a vibrating reed is used as an example will be shown and described.

A crystal oscillator 106 as the oscillator has a configuration in which a circuit element is further added to the configuration of the crystal vibrator 105. Portions in common with the crystal vibrator 105 are denoted by the same reference numerals and signs, and the descriptions thereof are omitted.

As shown in FIGS. 5A and 5B, the crystal oscillator 106 includes the piezoelectric vibrating reed 81 of the first embodiment, an IC chip 191 as a circuit element having an oscillator circuit which oscillates the piezoelectric vibrating reed 81, and the package 180 which contains the piezoelectric vibrating reed 81 and the IC chip 191. The IC chip 191 is fastened to the bottom of the package base 181 and connected to other wirings with metal wires 192 such as gold wires. The piezoelectric vibrating reed 81 is excited by a drive signal from the oscillator circuit of the IC chip 191, so that the crystal oscillator 106 oscillates (resonates) at a predetermined frequency (for example, 32.768 kHz).

As described above, since the crystal oscillator 106 includes the piezoelectric vibrating reed 81 with a small size and a low CI value described in the above embodiment, the crystal oscillator 106 with a small size and stable vibration characteristics can be provided.

Moreover, since at least any of the piezoelectric vibrating reeds 21, 41, and 81 and the circuit element (the IC chip 191) which oscillates the piezoelectric vibrating reed 21, 41, or 81 are incorporated into the package 180, an increase in CI value or unnecessary vibrations are suppressed, and higher performance is realized. Further, miniaturization can be achieved.

Even when the crystal oscillator 106 uses, instead of the piezoelectric vibrating reed 81, the piezoelectric vibrating reed 21 or 41, the same advantages can be obtained.

In the embodiment, the configuration in which the piezoelectric vibrating reed 81 is fixed to the connection pads 188 disposed at two places has been described. However, the number of places of the connection pad 188 is not limited to two, and a desired number of connection pads may be disposed. Also the connection with the piezoelectric vibrating reed 81 can be made at a desired connection place.

The above-described crystal vibrating reeds 21, 41, and 81 as piezoelectric vibrating reeds are small in size and have a low CI value and stable vibration characteristics.

Accordingly, the crystal vibrator 105 or the crystal oscillator 106 having the crystal vibrating reed 21, 41, or 81 packaged therein is widely used as a timing device or the like in electronic devices such as digital mobile phones, personal computers, electronic timepieces, video recorders, or television sets. Especially the crystal vibrator 105 or the crystal oscillator 106 can be suitably used in mobile devices exemplified by portable game devices or portable music devices which are required to be small in size and weight.

The entire disclosure of Japanese Patent Application Nos: 2009-234068, filed Oct. 8, 2009 and 2010-163647 filed Jul. 21, 2010 are expressly incorporated by reference herein.

What is claimed is:

1. A vibrating reed comprising:
   a base; and
   a vibrating arm which is extended from one end portion of the base,
   the vibrating arm having
   an arm portion which is disposed on the base side,
   a weight portion which is disposed on a tip side of the arm portion and has a larger width than the arm portion,
   main surfaces which are respectively disposed on front and back sides of the vibrating arm,
   side surfaces each of which extends in a longitudinal direction of the vibrating arm to connect the main surfaces on the front and back sides and which are formed so as to face each other,
   a first groove portion which is a bottomed groove formed at least one of the main surfaces along the longitudinal direction of the vibrating arm,
   a first excitation electrode which is formed on groove side surfaces each connecting a bottom of the first groove portion with the one main surface,
   a second excitation electrode which is formed on the both side surfaces, and
   a projection-in-groove which is disposed on the tip side of a bisector bisecting the vibrating arm in the longitudinal direction and is formed so as to be along the groove side surface with a part of the first groove portion interposed between the projection-in-groove and the groove side surface.

2. The vibrating reed according to claim 1, wherein the projection-in-groove is disposed so as to protrude, in plan view, from the tip side of the vibrating arm toward the base side within the first groove portion.

3. The vibrating reed according to claim 1, wherein the projection-in-groove is formed in an island shape with its periphery surrounded by the first groove portion in plan view.

4. The vibrating reed according to claim 1, further comprising a second groove portion formed in the weight portion, wherein
   the second groove portion is a bottomed groove which includes as one of side surfaces a side surface which is continuous from the side surface of the arm portion and forms the same surface as that of the arm portion, the one side surface being formed so as to be in parallel with the side surface of the first groove portion,
   the first groove portion is disposed so as to extend from the base side of the vibrating arm into a region of the weight portion,
   the first excitation electrode is formed on the side surface which is continuous within the first groove portion from the base side of the vibrating arm into the region of the weight portion, and
   the second excitation electrode is formed on a surface which is continuous from the side surface of the vibrating arm to the one side surface within the second groove portion.

5. The vibrating reed according to claim 1, wherein the projection-in-groove is formed to extend to the base side beyond a root portion of the weight portion with the vibrating arm.

6. The vibrating reed according to claim 1, wherein the projection-in-groove is formed continuously from the weight portion.

7. The vibrating reed according to claim 1, wherein the projection-in-groove is formed to have the same height as the both main surfaces of the vibrating arm.

8. The vibrating reed according to claim 1, which is a piezoelectric vibrating reed formed of a piezoelectric material.

9. A vibrator comprising:
   the vibrating reed according to claim 1; and
   a package which contains the vibrating reed.

10. An electronic device comprising the vibrator according to claim 9.

11. An oscillator comprising:
    the vibrating reed according to claim 1;
    a circuit element which includes an oscillator circuit oscillating the vibrating reed; and
    a package which contains the vibrating reed and the circuit element.

12. An electronic device comprising the oscillator according to claim 11.

13. An electronic device comprising the vibrating reed according to claim 1.

* * * * *